United States Patent [19]

Christopherson et al.

[11] Patent Number: 5,450,363
[45] Date of Patent: Sep. 12, 1995

[54] GRAY CODING FOR A MULTILEVEL CELL MEMORY SYSTEM

[75] Inventors: Mark Christopherson; Phillip M. Kwong, both of Folsom; Steven E. Wells, Citrus Heights, all of Calif.

[73] Assignee: Intel Corporation, Santa Clara, Calif.

[21] Appl. No.: 252,750

[22] Filed: Jun. 2, 1994

[51] Int. Cl.6 .............................................. G11C 7/00
[52] U.S. Cl. ..................... 365/205; 365/94; 365/104; 365/184
[58] Field of Search .................. 365/184, 205, 94, 104, 365/45

[56] References Cited

U.S. PATENT DOCUMENTS

| | | | |
|---|---|---|---|
| 4,202,044 | 5/1980 | Beilstein, Jr. et al. | 365/182 |
| 4,287,570 | 9/1981 | Stark | 365/104 |
| 4,388,702 | 6/1983 | Sheppard | 365/104 |
| 4,415,992 | 11/1983 | Adlhoch | 365/94 |
| 4,586,163 | 4/1986 | Koike | 365/104 |
| 4,653,023 | 3/1987 | Suzuki et al. | 354/104 |
| 4,701,884 | 10/1987 | Aoki et al. | 365/189 |
| 4,771,404 | 9/1988 | Mano et al. | 365/189 |
| 5,012,448 | 4/1991 | Matsuoka et al. | 365/208 |
| 5,043,940 | 8/1991 | Harari | 365/168 |
| 5,163,021 | 11/1992 | Mehrotra | 365/185 |
| 5,172,338 | 12/1992 | Mehrotra | 365/185 |
| 5,297,148 | 3/1994 | Harari | 371/10.2 |
| 5,351,210 | 9/1994 | Saito | 365/189 |

FOREIGN PATENT DOCUMENTS

4-40515  2/1992  Japan .

*Primary Examiner*—Viet Q. Nguyen
*Attorney, Agent, or Firm*—Blakely, Sokoloff, Taylor & Zafman

[57] ABSTRACT

A memory system contains a plurality of memory cells, a sensing circuit, and a translator circuit. The memory cells store one of a plurality of threshold levels, wherein the threshold levels demarcate windows for designating more than a single bit of data for each memory cell. The sensing circuit, coupled to the memory cells, generates at least one binary coded bit from the threshold level sensed. A translator circuit translates the binary coded bits to gray coded bits such that only one bit changes state between adjacent threshold levels. Because of this, a decrease from one threshold level to a lower adjacent threshold level in a memory cell results in the change of only a single bit of data, thus improving the memory system reliability. The memory system also includes the ability to store threshold states in either a multi-level cell mode or a standard level cell mode. In the standard cell mode, the translator circuit directly passes the binary coded bits without performing any translation.

19 Claims, 6 Drawing Sheets

GRAY CODING FOR A MULTILEVEL CELL MEMORY SYSTEM

FIELD OF THE INVENTION

The present invention relates to data storage in a memory device, and more specifically to methods and apparatus for encoding data for storage in a multi-level memory device.

BACKGROUND OF THE INVENTION

Memory devices have numerous applications for storing data. Some memory devices store a specific state by altering characteristics pertaining to the threshold of conduction of the device. Typically, in order to program data into the memory device, the threshold of conduction for the memory device is configured such that the conduction of current represents a first state and the non-conduction of current represents a second state. However, such a memory device is configurable to store a range of threshold levels. Such a device is suitable to store analog data. The storing of analog data permits storage of multiple bits of data in a single memory cell. This is known as a multi-level cell.

There are prior patents that discuss multi-level storage. U.S. Pat. No. 5,043,940 of Harrari for FLASH EEPROM MEMORY SYSTEMS HAVING MULTI-STATE STORAGE CELLS ("Harrari") defines multi-level states in terms of the threshold voltage $V_t$ of a split-channel flash electrically erasable read only memory (EEprom) memory cell. Using these four states, Harrari is able to store two bits of data per memory cell by applying multiple programming pulses to each memory cell. U.S. Pat. No. 5,163,021 of Mehrota et al. for MULTI-STATE EEPROM READ AND WRITE CIRCUITS AND TECHNIQUES ("Mehrota") also describes multilevel memory system. Like Harrari, Mehrota defines four states in terms of memory cell threshold voltage.

However, when storing more than a single bit per cell, the reliability of the memory system is diminished. Therefore, it is desirable to increase the reliability of a memory system capable of storing more than a single bit per cell. Because the integrity of data storage is more critical for some types of data than for others, it is desirable to store more than a single bit per cell in portions of a memory while storing a single bit per cell in other portions of the memory.

SUMMARY AND OBJECTS OF THE INVENTION

Therefore, it is an object of the present invention to store more than a single bit per memory cell.

It is another object of the present invention to increase the reliability of a memory system capable of storing more than a single bit per cell.

It is a further object of the present invention to increase the reliability of a memory system capable of storing more than a single bit per cell in portions of a memory while storing a single bit per cell in other portions of the memory.

These and other objects of the present invention are realized in an arrangement that includes a memory system containing a plurality of memory cells, a sensing circuit, and a translator circuit. In one embodiment, the memory cells are flash electrically erasable read only memory (EEprom) cells. The memory cells store one of a plurality of threshold levels, wherein the threshold levels demarcate windows for designating more than a single bit of data for each memory cell. The sensing circuit is coupled to the memory cells for sensing the threshold level from the memory cells. The sensing circuit generates at least one binary coded bit from the threshold level sensed. A translator circuit, coupled to the sensing circuit, translates the binary coded bits to gray coded bits such that only one bit changes state between adjacent threshold levels. Because of this, a decrease from one threshold level to a lower adjacent threshold level in a memory cell results in the change of only a single bit of data. This in effect reduces the average number of bit errors per cell.

In one embodiment, the memory system further includes a switch circuit for storing a plurality of threshold states in either a multi-level cell mode or a standard level cell mode. In the multi-level cell mode, more than a single bit per cell is stored. In the standard cell mode, the translator circuit directly passes the binary coded bits without performing any translation. The memory system is constructed to store one of four threshold levels in each cell to represent two bits of data. A comparator circuit generates a 0, 0 binary code for a first threshold level, a 1, 0 binary code for a second threshold level, a 0, 1 binary code for a third threshold level, and a 1, 1 binary code for a fourth threshold level. For this binary code, the translator circuit translates the 0, 0 binary code to a 1, 0 gray code, the 1, 0 binary code to a 0, 0 gray code, the 0, 1 binary code to a 0, 1 gray code, and the 1, 1 binary code to a 1,1 gray code.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

Figure 1:
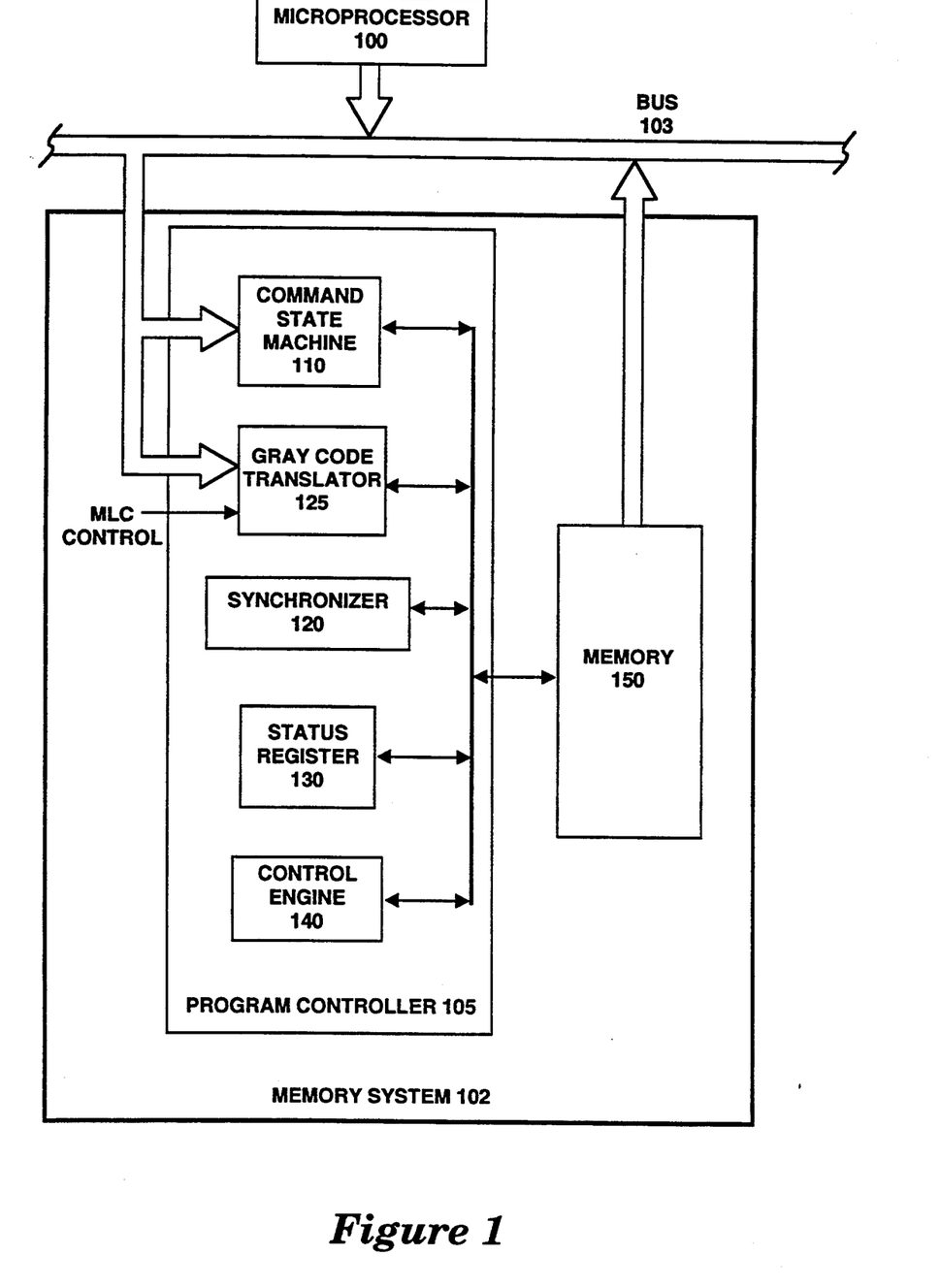
FIG. 1 is a high level block diagram illustrating a memory system and microprocessor.

FIG. 1 illustrates a system block diagram configured in accordance with one embodiment of the present invention. The present invention has application for use in any system utilizing a multi-level memory, such a computer system. A portion of such a computer system including a microprocessor 100, bus 103 and memory system 102 is shown in FIG. 1. A memory system 102 contains a program controller 105 and a multi-level memory 150. The microprocessor 100 coupled, via the bus 103, to the program controller 105. The program controller 105 provides the necessary operations to control the multi-level memory 150. In one embodiment, the program controller 105 and multi-level memory 150 are located on a single integrated circuit die. The program controller 105 contains a command state machine 110, a gray code translator 125, a synchronizer 120, a status register 130 and a control engine 140. The multi-level memory 150 contains the memory array as will be described more fully below.

In operation, the microprocessor 100 generates commands to program, erase and read the cells within the multi-level memory 150. Through use of the command structure, the microprocessor 100 specifies the type of operation (e.g. read, program/verify, erase/verify), and an address specifying the multi-level memory cells for the operation. In addition, for a program/verify operation, the microprocessor 100 transfers data for programming into the memory 150. The command state machine 110 receives the commands from the microprocessor 100. In turn, the command state machine 110 directs the control engine 140 to execute the specified operation in the multi-level memory 150.

In one embodiment, the control engine 140 comprises a microcontroller that executes micro code stored in a memory. The control engine 140 generates the necessary timing, control and address operations to the multi-level memory 150. In addition, the control engine 140 receives data from the gray code translator 125 to control the programming of the memory 150. The synchronizer 120 permits asynchronous or synchronous operation of the multi-level memory 150 with the microprocessor 100. The status register 130 stores status information pertaining to the memory system 102. For a further description of an on-chip program controller, such as program controller 105, see U.S. patent application Ser. No. 07/655,650, filed Feb. 11, 1991, entitled Flash Memory Erase Suspend and Resume, inventor Fandrich, and assigned to the assignee of the present invention, Intel Corporation, Santa Clara, Calif.

For a program/verify operation, the gray code translator 125 receives data transferred from the microprocessor 100. In addition, the gray code translator 125 receives a multi-level cell (MLC) control signal. The generation of the MLC control signal is described fully below. If the MLC signal is active, then the gray code translator 125 translates the data in accordance with the gray coding scheme of the present invention. If the MLC signal is not active, then the gray code translator 125 passes the data without any conversion. The operation of the gray code translator 125 to translate the data for programming is analogous with the operation of the a gray code translator utilized to sense the data from the memory. A complete description of the gray coding scheme and the gray code translator of the present invention is described below.

The present invention has application for use in a memory system capable of storing more than a single bit of information in each cell. In one embodiment, the cells of the memory device are constructed as flash electrical erasable programmable read only memory (flash EEprom) cells. Although the present invention is described in conjunction with flash EEprom cells, other cells, such as read only memory (ROM), erasable s programmable read only memory (EPROM), conventional electrical erasable programmable read only memory (EEPROM), or dynamic random access memory (DRAM) may be substituted without deviating from the spirit and scope of the invention.

The flash EEprom memory device is organized in blocks of EEprom cells, wherein a particular block is programmed and erased simultaneously. The flash EEprom devices are non-volatile memory devices such that once programmed by a user, the EEprom cells retain the state programmed until erased. In one embodiment, the flash EEprom cells consist of a single transistor having a select gate, a floating gate, a source, and a drain. The source and drain reside on the substrate, and the substrate is grounded. The floating gate is insulated from the select gate and the channel region of the cell by a non-conductive oxide to permit retention of charge on the floating gate.

The flash EEprom memory cell is turned on and off by the absence or presence of charge on the floating gate. During programming, the electrons are placed on the floating gate, and are trapped by surrounding non-conductive oxide. If electrons reside on the floating bate, the field effect generated by the excess electrons results in a high threshold of conductivity for the memory cell. When a voltage is applied to the select gate of such a memory cell, the memory cell is turned off, thereby storing a first logic state. When no excess electrons are trapped on the floating gate, however, the memory cell exhibits a lower threshold of conduction, and the memory cell conducts current to represent a different logic state.

The floating gate can retain a range of charges, and therefore the memory cell can be programmed to exhibit multiple, thresholds of conduction or multiple threshold levels ($V_t$). By storing multiple thresholds levels on the floating gate of the cell, the memory cell may be programmed to store more than a single bit. In order to discern the multiple threshold levels, the memory system designates threshold windows. Each threshold window specifies a memory state of the cell. The multiple threshold levels demarcate $2^n$ number of windows for designating states to represent storage of "n" bits of data for the memory cells. The present invention is described in conjunction with a memory cell capable of storing four states to represent two bits. However, the present invention applies to a memory cells storing three or more states.

In order to read the state stored in an addressed flash EEprom memory cell, an operating voltage is placed across the source and drain, and on the control gate to address the cell. The state of the addressed cell is measured by detecting the level of current flowing between the source and drain. The level of current flowing between the source and drain is proportional to the threshold level of the addressed EEprom memory cell. The level of current flowing from the addressed cell is compared against a reference current generated from a reference cell. In one embodiment, the reference cell is also an EEprom cell, and the cell is one time programmable to a proper threshold of conduction. A sensing scheme for the multi-level memory is described more fully below.

As discussed above, a flash EEprom memory cell, as well as other types of memory cells, is configurable to store multiple threshold levels ($V_t$). In a memory cell capable of storing two bits per cell, four threshold levels ($V_t$) are required. Consequently, two bits are designated for each threshold level. Table 1 illustrates logic level designations for four threshold levels ($V_t$) configured in accordance with one embodiment of the present invention.

TABLE 1

| $V_t$ Levels | Logic Level | |
|---|---|---|
| | $Bit_1$ | $Bit_0$ |
| Level 0 | 0 | 0 |
| Level 1 | 1 | 0 |
| Level 2 | 0 | 1 |
| Level 3 | 1 | 1 |

For the threshold levels shown in Table 1, level 0 is the highest threshold level, and level 3 is the lowest threshold level. Although the present invention is described in conjunction with the logic level designations for the threshold levels ($V_t$) as set forth in Table 1, other logic level designations for the threshold levels may be used without deviating from the spirit or scope of the invention.

Figure 2:
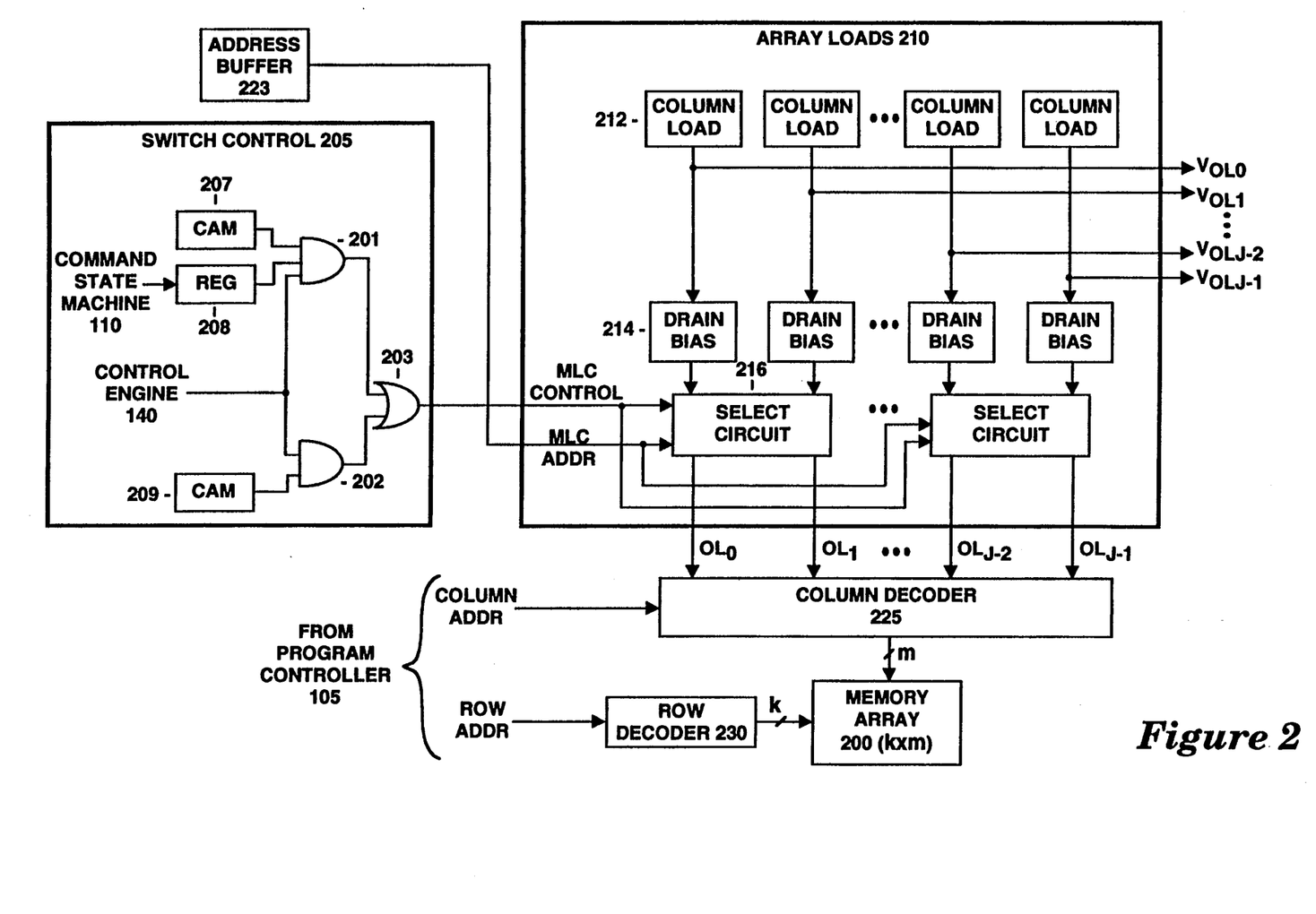
FIG. 2 illustrates the multi-level memory configured in accordance with one embodiment of the present invention.

FIG. 2 illustrates the multi-level memory 150 configured in accordance with one embodiment of the present invention. The multi-level memory 150 permits switching between a multilevel cell (MLC) operating mode and a standard single cell operating mode. In the MLC mode, the multi-level memory 150 stores more than a single bit per cell. In one embodiment, the multi-level memory 150 stores two bits per cell when operating in the MLC mode. When operating in standard mode, the multi-level memory 150 stores a single bit per cell. Although the present is described in conjunction with a memory system storing two bits per cell, any number of bits per cell may be stored in a single cell without deviating from the spirit and scope of the present invention.

In order to switch between operating in the MLC mode and the standard mode, the multi-level memory 150 contains a switch control 205. In general, the control switch 205 generates an active MLC control signal to indicate that the multi-level memory 150 is operating in the MLC mode. In one embodiment, the switch control 205 contains CAM cells 207 and 209. The CAM cells 207 and 209 are factory programmable. When the CAM cell 209 is programmed or blown, the multi-level memory 150 potentially operates in the MLC mode. The programming of CAM cell 207 permits switching of the multi-level memory 150 between the MLC mode and the standard mode via a command. A register 208, coupled to the command state machine 110, permits selection between the MLC mode and the STD mode through the command control interface.

The switch control 205 also contains AND gates 201, 202, and an OR gate 203. The control engine 140 is coupled to the AND gates 201 and 202 to permit the control engine 140 to override the selection of the operating mode residing in the register 208. Consequently, the switch control 205 generates an MLC control signal via the command state machine 110 or control engine 140 to select operation of the MLC mode.

Because the memory circuit of the present invention permits operation in both the MLC and the standard cell modes, an addressing scheme to access the memory in both modes is required. In one embodiment, the addressing scheme maintains address coherency between operation in the MLC and standard cell modes. For a memory system capable of storing two bits per cell, an extra address, entitled the multi-level cell address (MLC addr), is provided to access the additional memory locations generated by storing more than a single bit per cell. In standard cell mode, each address identifies a unique word in the memory array 200. In MLC mode, each address the same identifies the same word in the memory array 200. However, in the MLC mode, the MLC address identifies half of the cells that store the 16 bits of data.

If a memory system stores two bits per ,cell when operating in the MLC mode, then the memory system stores twice the data when operating in the MLC mode than operating in the standard cell mode. For example, a memory array operating in the standard cell mode that stores 16 bit words requires 16 cells to store the 16 bit word. For the same memory array operating in the MLC mode and storing two bits per cell, only 8 cells are required to store the same 16 bit word. Therefore, if a single address identifies the 16 bit word when operating in the standard cell mode, then an additional address bit is required when operating in the MLC mode to identify which of the 8 cells store the 16 bits. The operation of selecting cells within a word for operation in the MLC mode is described more fully below.

By utilizing the MLC address to select 8 cells within the 16 cells addressable by the standard addressing mode, address coherency is maintained between the multi-level cell mode and standard modes. For a further description of addressing for a memory device capable of operating in both a MLC and standard modes, see. U.S. patent application Ser. No. 08/252,920, entitled Addressing Modes For A Dynamic Single Bit Per Cell To Multiple Bit Per Cell Memory, inventors Stephen E. Wells and Curt B. Robinson, filed concurrently with the present application, and assigned to assignee of the present invention, Intel Corporation, Santa Clara, Calif.

The multi-level memory 150 further includes an address buffer 223 for storing the MLC addr. In one embodiment, the MLC addr is received from an input pin on the memory system 102. In an alternative embodiment, the MLC addr is input to the address buffer 223 from the program controller 105. In the alternative embodiment, the MLC addr is specified in a command when the memory is operating in the MLC mode.

The multi-level memory 150 shown in FIG. 2 contains array loads 210, a column decoder 225, a row decoder 230, and memory array 200. The array loads 210 generate, in part, output line or column loads for selected bit lines in the memory array 200. By generating output line loads, the array loads 210 output to a sensing system 220 (FIG. 3) a voltage representing the level of conductivity exhibited by the addressed cells of memory array 200. The memory array 200 is arranged as having k words and j columns. In one embodiment, sixteen memory cells are accessed for a read operation. The column decoder 225 receives a column address from the program controller 105, and couples the column loads from the array loads 210 to the selected bit lines in memory array 200. The row decoder 230 receives a row address from the program controller 105 and, selects the specified word within the memory array 200. The column decoder 225 and row decoder 230 are intended to represent a broad category of decoders used to select bit lines and word lines in memory arrays which are well known in the art and will not be described further.

Each output line in the array loads 210 contains a column load 212 and a drain bias 214. The column load 212 provides a resistance to generate a voltage, $VO_L$, in accordance with the conduction of current in a selected memory cell. In one embodiment, the column load 212 is implemented with a metal oxide field effect transistor (FET) operating in the saturated region. The column load is coupled to a source voltage, such as Vcc. The drain bias 214 biases the corresponding output line to generate the proper drain voltage for the addressed memory cell in the memory array 200. In one embodiment, the drain bias 214 is configured as a cascode circuit. The array loads 210 also contain a select circuit 216 for every two output lines (e.g. each odd and even output line are input to one select circuit 216). In general, the select circuit 216 connects the column loads 212 and drain biases 214 on the output lines to the selected cells to support operation of the memory in both the MLC and standard cell modes. The operation of the select circuit 216 is described more fully below.

Figure 3:
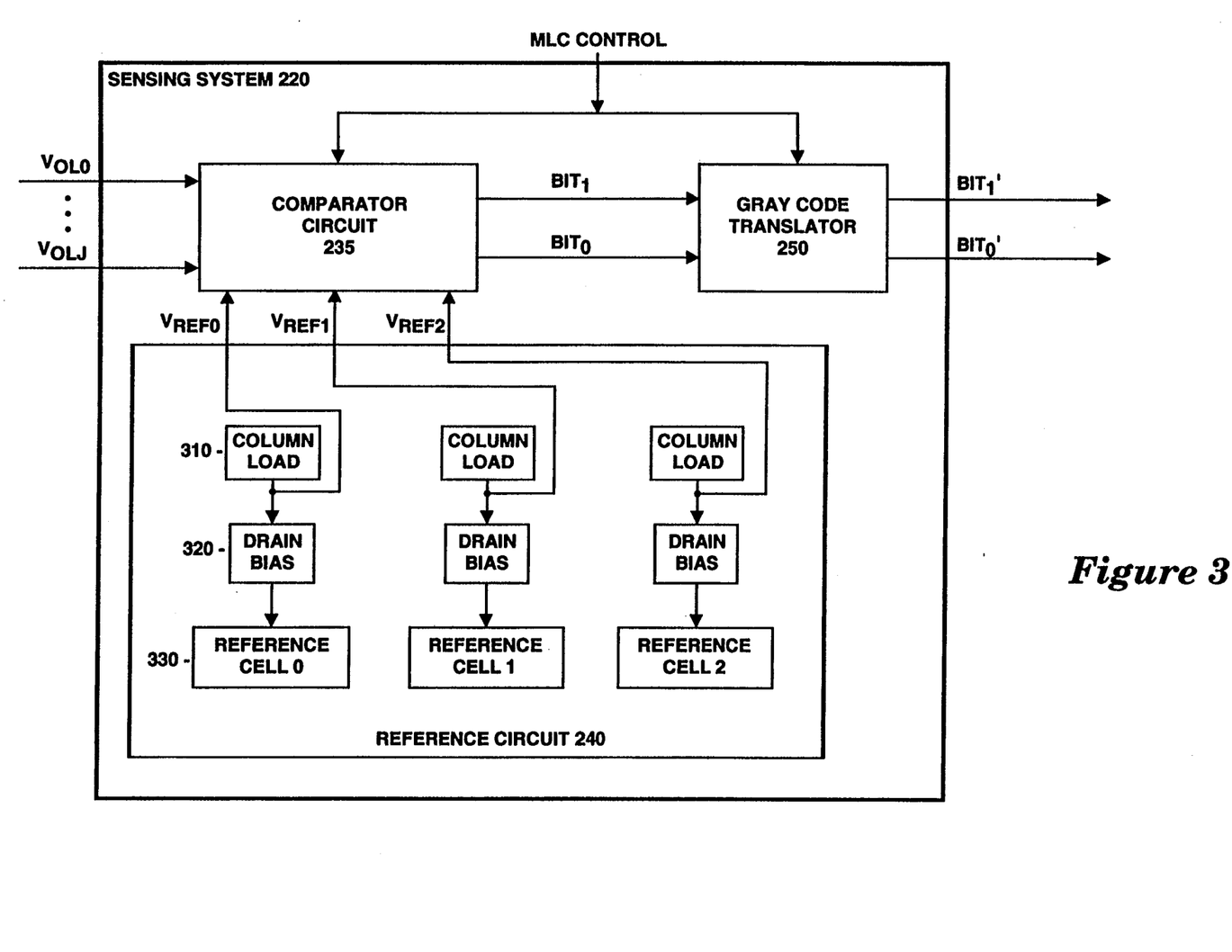
FIG. 3 illustrates a sensing system configured in accordance with one embodiment of the present invention.

FIG. 3 illustrates a sensing system configured in accordance with one embodiment of the present invention. A sensing system 220 contains a reference circuit 240, a comparator circuit 235, and a gray code translator 250. The reference circuit 240 generates a plurality of reference voltages ($V_{ref}$). The comparator circuit 235 receives the output line voltages ($V_{OL}$) generated by the addressed cells in the memory array 200, and compares the output line voltages ($V_{OL}$) with the reference voltages ($V_{ref}$) generated from the reference circuit 240. The output of the comparator circuit 235 is input to the gray code translator 250. When operating in the MLC mode, the gray code translator 250 translates the bits output from the comparator 235 ($BIT_1$ and $BIT_2$) in accordance with the gray coding scheme of the present invention, and generates $BIT'_1$ and $BIT'_2$. The gray code scheme and the operation of the gray code translator is described more fully below.

The reference circuit 240 generates a plurality of reference voltages ($V_{ref}$) for use in comparison with the output line voltages ($V_{OL}$). The reference circuit 240 generates "n-1" reference voltages for "n" states or levels stored in the multi-level memory cells. Therefore, in a memory system capable of storing four states to represent 2 bits, the reference circuit 240 generates three voltage levels, $V_{ref0}$, $V_{ref1}$, and $V_{ref2}$. The $V_{ref0}$ voltage level is between the output line voltages for a level 0, and a level 1 storage, the $V_{ref1}$ voltage level is between the output line voltages for a level 1 and a level 2 storage, and the $V_{ref2}$ voltage level is between the output line voltages for a level 2 and a level 3 storage.

In order to generate the reference voltage levels, the reference circuit 240 contains a reference cell 330 for each reference voltage. The reference cells comprise one-time trimmable EEPROM cells. Each reference cell 330 includes a corresponding column load 310 and drain bias 320. The operation of the column load 310 and the drain bias 320 is analogous with the operation of the column load 212 and drain bias 214 contained in the array loads 210. The reference voltages ($V_{ref}$) are equal to a voltage drop across the column load 310 which is proportional to the conduction of current in the corresponding reference cell 330.

Figure 4:
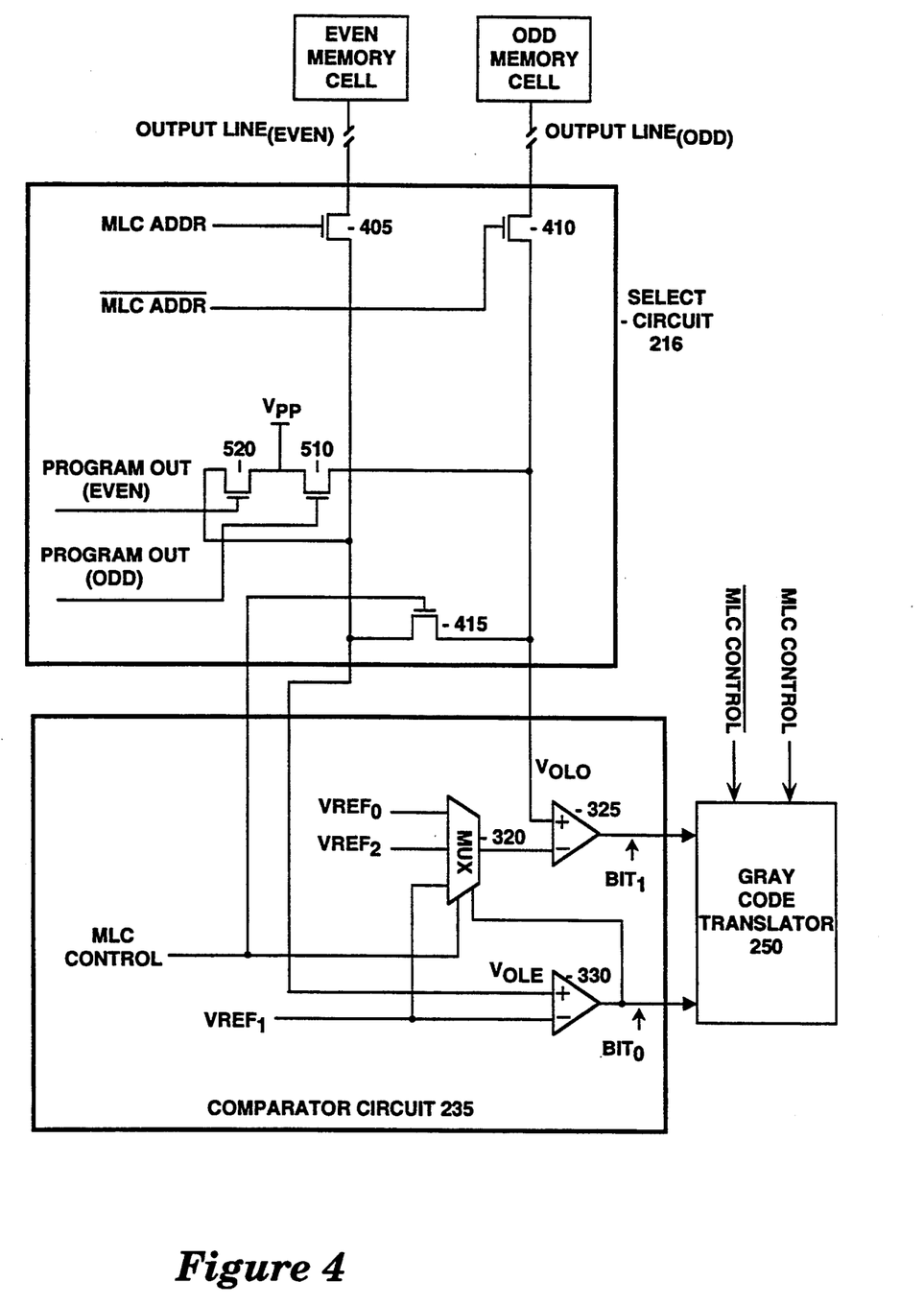
FIG. 4 illustrates a select circuit, a comparator circuit, and a gray code translator configured in accordance with one embodiment of the present invention.

FIG. 4 illustrates the select circuit 216, a portion of the comparator circuit 235, and the gray code translator 250 configured in accordance with one embodiment of the present invention. As discussed above, each select circuit 216 receives an odd and even output line. For the select circuit 216 illustrated in FIG. 4, even and odd output lines are input. For each output line input to the select circuit 216, a pass transistor is utilized. In one embodiment for the select circuit 216, a n-channel FET 405 is coupled to the even output line, and a n-channel FET 410 is coupled to the odd output line. The gate of transistor 405 is coupled to the MLC address, and the gate of transistor 410 is coupled to an inverted MLC address or $\overline{MLC}$ address. The select circuit 216 also contains a pass transistor 415. The transistor 415 couples the odd output line to the even output line, and the gate of transistor 415 is coupled to the MLC control signal.

In operation, if the memory system 105 is operating in the MLC mode, then the MLC control signal biases transistor 415 to electrically couple the even output line to the odd output line. The MLC address selects either the even output line or the odd output line, thereby electrically coupling the comparator circuit 235 to the selected odd or even memory cell. Consequently, when operating in the MLC mode, either the odd or the even memory cell is coupled to both of the odd and even output lines based on the MLC address. In standard mode, both MLC address and $\overline{MLC}$ address are set to a high logic level, and MLC control turns off the transistor 415. Consequently, the even memory cell is electrically coupled to the comparator circuit 235 via the even output line, and the odd memory cell is electrically coupled to the comparator circuit 235 via the odd output line.

For every two output lines, such as an odd and even output line, the comparator circuit 235 contains two comparators, comparators 325 and 330, and a multiplexor (MUX) 320. The comparator 330 receives, as inputs, the even output line voltage, $V_{OLe}$, and the $V_{ref1}$ voltage reference for comparison. The output of the comparator 330 is designated as $BIT_O$. For a memory array capable of storing four states per memory cell, the MUX 320 receives as inputs the voltage references generated from the reference circuit 240 (e.g. $V_{ref0}$, $V_{ref1}$, and $V_{ref2}$). The MUX 320 outputs a reference voltage $V_{ref0}$, $V_{ref1}$, or $V_{ref2}$, based on the state of the MLC control and the output of comparator 330. The comparator 325 receives, as inputs, the odd output line voltage, $V_{OLo}$, and the selected voltage reference (e.g. $V_{ref0}$, $V_{ref1}$, and $V_{ref2}$) for comparison. The output of the comparator 325 is designated as $BIT_1$. The $BIT_0$ and $BIT_1$ are input to the gray code translator 250.

When operating in the MLC mode, the even output line is coupled to the odd output line (e.g. the $V_{OLe}$ voltage level is equal to the $V_{OLo}$ voltage level). If the $V_{OLe}$ voltage level generated by the selected cell is greater than the $V_{ref1}$ voltage level, then a "1" or high logic level is output from the comparator 330. Alternatively, if the $V_{OLe}$ voltage level is less than the $V_{ref1}$ voltage level, then a "0" or low logic level is output from the comparator 330. The output of the comparator 330 and the MLC control signals are utilized as the select for the MUX 320. If the output of comparator 330 is a low logic level and the MLC control is active high indicating the memory is operating in the MLC mode, then the $V_{ref0}$ voltage level is selected for comparison with the $V_{OLo}$.

If the $V_{OLo}$ voltage level is greater than the $V_{ref0}$ voltage level, then the output of comparator 325 is a high logic level. Alternatively, if the $V_{OLo}$ voltage level is less than the $V_{ref0}$ voltage level, then the output of comparator 325 is a low logic level. If the output of comparator 330 is a high logic level and the MLC control signal is active, the then $V_{ref2}$ voltage level is selected for comparison against the $V_{OLo}$. If the $V_{OLo}$ voltage level is less than the $V_{ref2}$ voltage level, then the output of comparator 325 is a low logic level. Alternatively, if the $V_{OLo}$ voltage level is greater than the $V_{ref2}$ voltage level, then the output of comparator 325 is a high logic level. When operating in the MLC mode, the $BIT_0$ and $BIT_1$ bits represent the state of a single cell.

If the multi-level memory system 102 is operating in the standard mode, then the $V_{OLe}$ voltage level on even output line is generated from a first selected memory cell, and the $V_{OLo}$ voltage level on odd output line is generated from a second selected memory cell. An inactive MLC control signal selects the $V_{ref1}$ voltage level at MUX 320 for input to the comparator 325. In this way, the $VOL_e$ voltage level is compared against the $V_{ref1}$ voltage level in comparator 330, and the $V_{OLo}$ voltage level is compared against the $V_{ref1}$ voltage level in comparator 325. Therefore, the output of comparator circuit 235 represents two bits, wherein the first bit is stored in the first selected memory cell, and the second bit is stored in the second selected memory cell.

The present invention utilizes gray coding to increase the reliability of the multi-level memory system. Table 2 illustrates the gray coding scheme for a multi-level cell memory system capable of storing four levels.

TABLE 2

| $V_t$ Levels | Logic Level | |
|---|---|---|
| | $Bit_{1'}$ | $Bit_{0'}$ |
| Level 0 | 1 | 0 |
| Level 1 | 0 | 0 |
| Level 2 | 0 | 1 |
| Level 3 | 1 | 1 |

As shown in Table 2, the $V_t$ level 0 is represented by $Bit_{0'}$ and $Bit_{1'}$ being set to 1 and 0, respectively; the $V_t$ level 1 is represented by $Bit_{0'}$ and $Bit_{1'}$ being set to 0 and 0, respectively; $V_t$ level 2 is represented by $Bit_{0'}$ and $Bit_{1'}$ being set to 0 and 1, respectively; and $V_t$ level 3 is represented by $Bit_{0'}$ and $Bit_{1'}$ being set to 1 and 1, respectively. As shown by comparing Table 1 and Table 2, the gray coding scheme of the present invention results in only changing a single bit as the $V_t$ levels increment or decrement from one adjacent state to the next. Before gray coding the bit levels, a change between the $V_t$ level 1 and the $V_t$ level 2 results in changing two bits (e.g. both $Bit_0$ and $Bit_1$ change state).

In flash EEprom cells, errors most commonly occur when the effective voltage threshold of a cell decreases such that a previously programmed $V_t$ level drops to the window of a lower $V_t$ level. The decrease of the effective voltage threshold level may be due to a charge loss on the gate of the flash cell or due to an opposing electric field generated by electrons trapped in the dielectric surrounding the floating gate. By utilizing the gray code scheme of the present invention, only a single bit of the two bits change state. For example, if an error occurs because an effective threshold level of a memory cell storing a $V_t$ level 0 state slips to a $V_t$ level 1 state, then only the $Bit_{0'}$ bit changes at the output of the gray code translator 250. The use of gray coding permits greater reliability and more effective, implementation of error detection and correction systems because less additional overhead bits are required to detect and correct fewer potential errors. If errors occur equally among threshold levels, then the gray coding scheme of the present invention reduces errors by thirty three percent. Without the use of gray coding in the multi-level memory system, more bits of error correction may be required.

Figure 5:
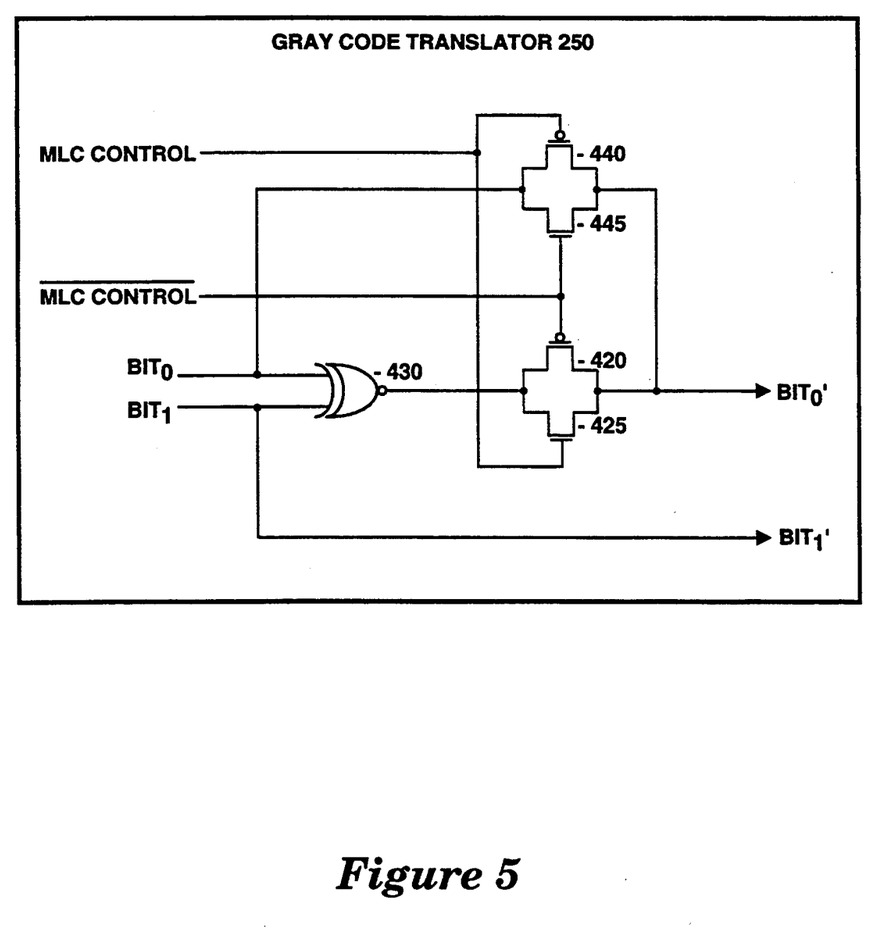
FIG. 5 illustrates a gray code translator configured in accordance with one embodiment of the present invention.

FIG. 5 illustrates the gray code translator 250 configured in accordance with one embodiment of the present invention. In general, the gray code translator 250 is a switchable gray code translator such that the conversion of the output levels only occur when the multi-level memory system is operating in the MLC mode. When operating in the standard cell mode, the gray code translator 250 passes the data unchanged. The gray code translator 250, receives as inputs $Bit_0$ and $Bit_1$ from the comparator circuit 235, and generates as outputs $Bit_{0'}$ and $Bit_{1'}$ in accordance with the $V_t$ levels shown in Table 2.

In one embodiment, the gray code translator 250 contains two pass gates and an exclusive OR (XOR) gate 430. The exclusive XOR gate 430 receives $Bit_0$ and $Bit_1$ as inputs. A first pass gate contains a p-channel FET 440, and a n-channel FET 445. The first pass gate receives as an input $Bit_0$ and is controlled by the MLC control signal and the $\overline{MLC}$ control signal. The first pass gate directly passes $Bit_0$ to $Bit_{0'}$ when the MLC control signal is inactive (e.g. when operating in said standard cell mode). When the MLC control signal is active, the first pass gate floats, thereby not providing an output to the $Bit_{0'}$.

A second pass gate contains a p-channel FET 420, and a n-channel FET 425. The second pass gate receives, as an input, the output of XOR gate 430 and is controlled by the MLC control signal and the $\overline{MLC}$ control signal. The second pass gate couples the output of the XOR gate to the $Bit_{0'}$ when operating in the MLC mode. When the MLC control signal is inactive, the second pass gate floats, thereby not providing an output to the $Bit_{0'}$.

Table 3 illustrates the truth table for the gray code translator 250 of the present invention.

TABLE 3

| $V_t$ Level | $Bit_1$ | $Bit_0$ | MLC Mode | | Standard Mode | |
|---|---|---|---|---|---|---|
| | | | $Bit_{1'}$ | $Bit_{0'}$ | $Bit_{1''}$ | $Bit_{0''}$ |
| Level 0 | 0 | 0 | 1 | 0 | 0 | 0 |
| Level 1 | 1 | 0 | 0 | 0 | 1 | 0 |
| Level 2 | 0 | 1 | 0 | 1 | 0 | 1 |
| Level 3 | 1 | 1 | 1 | 1 | 1 | 1 |

When the memory system is operating in standard mode, as indicated by the MLC control signal, the output $Bit_{0'}$ and $Bit_{1'}$ are identical to the input $Bit$ and $Bit_1$, respectively. However, when operating in MLC mode, the gray code translator 250 inverts the input $Bit_1$ when the $V_t$ level is 0 or 1. Consequently, the gray code translator 250 permits use of gray and non-gray codes in either multi-level or standard cell implementations.

Figure 6:
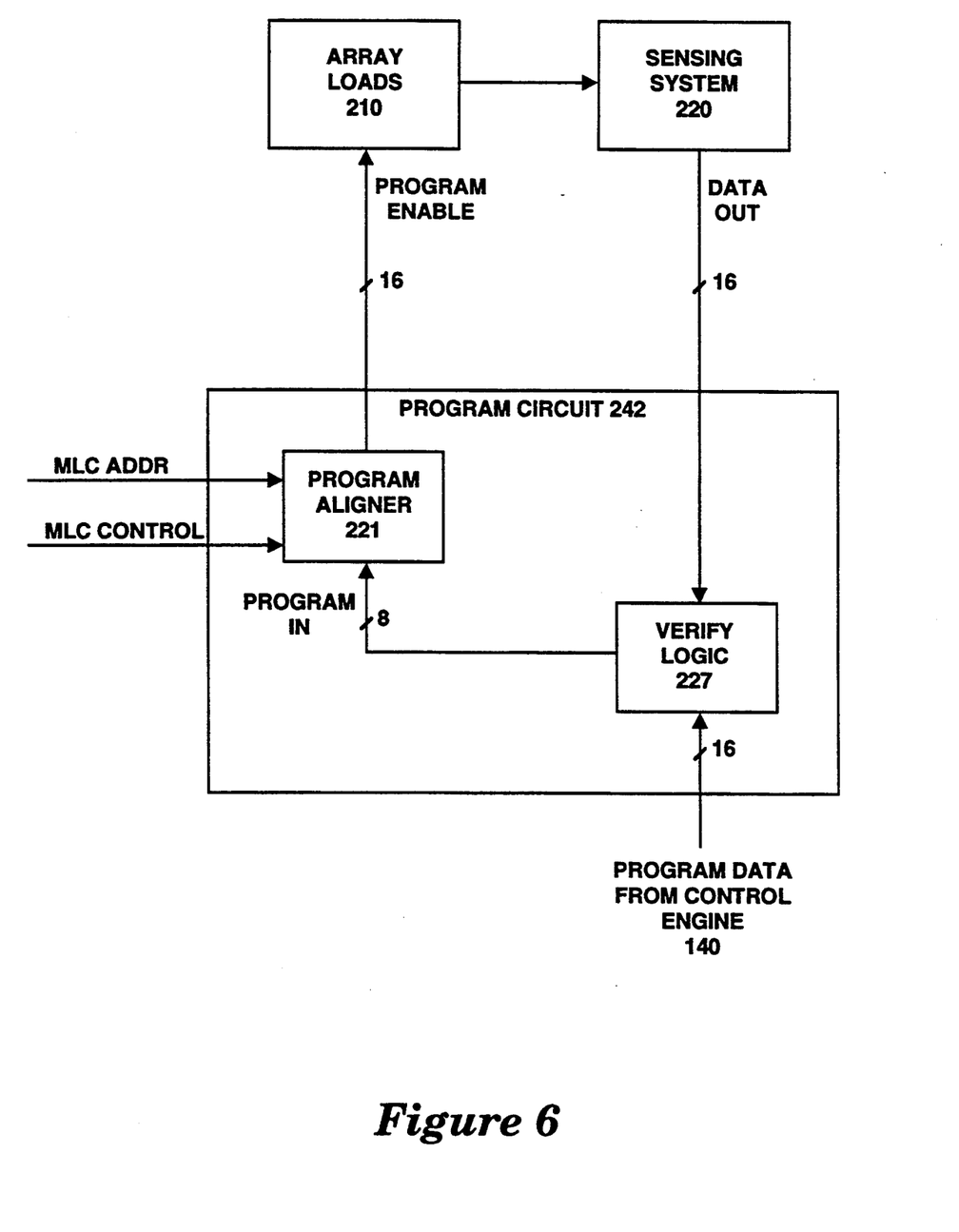
FIG. 6 is a high level block diagram illustrating the program/verify and erase/verify system configured in accordance with one embodiment of the present invention.

FIG. 6 is a high level block diagram illustrating the program/verify and erase/verify system configured in accordance with one embodiment of the present invention. The program circuit 242 contains verify logic 227 and program aligner 221. FIG. 6 illustrates programming of sixteen bits for each wordline. However, any number of memory cells may be used without deviating from the spirit and scope of the invention. In order to program memory cells in the memory array 200, the control engine 140 stores program data for programming. As discussed above, the gray code translator 125 translates the data in accordance with the gray coding scheme of the present invention when the memory is operating in the MLC mode. When operating in the MLC mode, the program aligner 221 selects only a portion of the cells identified by the address for programming.

In operation, verify logic 227 receives "data out", from the sensing system 220, and generates "program in" data to indicate which cells in the memory array 200 require additional programming. For example, for a memory system that senses 16 bits simultaneously, the output of the sensing system 220 is a 16 bit word. When operating in the MLC mode, the verify logic 227 generates 8 bits of "program in" data to identify which cells, that store the 16 bit word, require additional programming. When operating in the standard cell mode, the verify logic 227 generates 16 bits of "program in" data corresponding to the 16 bits selected (not shown). When operating in the standard cell mode, the program aligner 221 directly passes the "program in" data as the "program enable" data.

In order to select the proper 8 cells for programming in the MLC mode, the programming aligner 221 receives the MLC addr. Based on the MLC addr, the program aligner 221 outputs 16 bits of "program enable" data to enable programming of the selected 8 memory cells. As discussed above, when operating in the MLC mode, either the even output lines or the odd output lines are selected. For example, if the even cells are selected, then the program aligner 221 generates program enable data that enables only the "even" memory cells that require additional programming.

The verify logic 227 incorporates a compare function. In the standard cell mode, the verify logic 227 performs a single bit comparison to determine whether a memory cell requires programming to the "0" state. In the MLC mode, the compare function involves an analog comparison of the threshold levels stored in the memory cells with the program data. The verify logic 227 compares the program data with the current data sensed from the sensing system 220, and determines whether the memory cells require additional programming. Table 4 illustrates the analog comparison function for MLC mode operation configured in accordance with the threshold levels disclosed in Table 1. As shown in Table 1, the level 0, the highest level, corresponds to bits "00", and the level 3, the lowest level, corresponds to bits "11". A "1" output indicates that the memory cell requires additional programming. For example, to program bits "00" in a single cell that currently stores bits "10", the verify logic 227 outputs a 1 "program in" data bit. The 1 "program in" data bit indicates that the memory cell requires additional programming to go from level 1 to level 0.

TABLE 4

| "Program" | "Current" | "Output" |
|---|---|---|
| 00 | 00 | 0 |
| 00 | 01 | 1 |
| 00 | 10 | 1 |
| 00 | 11 | 1 |
| 01 | 00 | 0 |
| 01 | 01 | 0 |
| 01 | 10 | 1 |
| 01 | 11 | 1 |
| 10 | 00 | 0 |
| 10 | 01 | 1 |
| 10 | 10 | 0 |
| 10 | 11 | 1 |
| 11 | 00 | 0 |
| 11 | 01 | 0 |
| 11 | 10 | 0 |
| 11 | 11 | 0 |

The program aligner 221 receives the 8 "program in" bits from the verify logic 227, and generates the 16 "program enable" data based on the MLC addr. Table 5 illustrates a truth table for the program aligner circuit 221. A "1" program enable indicates that the corresponding output line is enabled for programming.

TABLE 5

| MLC ADDR | Program In | Program Enable (even) | Program Enable (odd) |
|---|---|---|---|
| 0 | 0 | 0 | 0 |
| 0 | 1 | 1 | 0 |
| 1 | 0 | 0 | 0 |
| 1 | 1 | 0 | 1 |

The "program enable" data from the program aligner 221 is input to the select circuit 216 for each pair of output lines in the memory system. As shown in FIG. 4, in order to program the memory cells, each select circuit 216 contains transistors 510 and 520. In one embodiment, the transistors are implemented with n-channel FET devices. The transistor 520 couples the programming voltage, $V_{pp}$, to the even output line, and the transistor 510 couples the programming voltage $V_{pp}$ to the odd output line. The program enable (even) signal controls the gate of transistor 520, and the program enable (odd) signal controls the gate of transistor 510. In operation, when a high logic level appears on either program enable (even) or program enable (odd), then the programming voltage $V_{pp}$ is coupled to the corresponding output line permitting additional programming to occur on the selected cell.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A memory comprising:
   a plurality of memory cells for storing one of a plurality of threshold levels in said memory cells to store more than one bit of data in each memory cell, wherein said threshold levels demarcate windows for designating more than a single bit of data for each memory cell; and
   a sensing circuit coupled to said memory cells for sensing said one of said plurality of threshold levels from at least one selected memory cell, and for generating a gray coded value to represent said one of said plurality of threshold levels sensed such that only one digit of said gray coded value changes state between adjacent threshold levels, wherein a decrease from one threshold level to a lower adjacent threshold level in a memory cell results in the change of only a single digit of said gray coded value, thereby providing increased reliability for said memory.

2. The memory as set forth in claim 1, further comprising:
   a first translator circuit coupled to receive binary coded data for storage in said memory cells for translating said binary coded data to gray coded data such that only one bit changes state between adjacent threshold levels; and
   a program circuit coupled to said translator circuit for writing said gray coded data in said memory cells.

3. The memory as set forth in claim 1, further comprising a switch circuit coupled to said memory cells and said sensing circuit for controlling storage in said memory cells to store more than a single bit per memory cell when operating in a multi-level cell mode, and for controlling storage in said memory cells to store a single bit per memory cell when operating in a standard cell mode, said sensing circuit being configured to generate a binary coded value when operating in said standard cell mode.

4. The memory as set forth in claim 3, wherein said sensing circuit comprises a second translator circuit having two outputs for generating a two digit gray coded value such that a first output represents a first digit and a second output represents a second digit, said second translator circuit comprising:

at least one exclusive OR circuit coupled to receive two bits of a binary code for generating an exclusive OR output, a second bit of said binary coded data being passed to generate said second output;

a first pass gate coupled to said switch control for directly coupling a first bit of said binary code to said first output when operating: in said standard cell mode; and a second pass gate coupled to said switch control and said exclusive OR circuit for coupling said exclusive OR output to said first output when operating in said MLC mode.

5. The memory as set forth in claim 1, wherein said memory cells comprises a plurality of flash electrically erasable read only memory (EEprom) cells.

6. The memory as set forth in claim 1, wherein said memory system is configured to store one of four threshold levels to represent two bits of data for each memory cell.

7. The memory as set forth in claim 6, wherein said sensing circuit comprises a comparator circuit, coupled to said selected memory cell, for generating a 0, 0 binary code for a first threshold level, for generating a 1, 0 binary code for a second threshold level, for generating a 0, 1 binary code for a third threshold level, and for generating a 1, 1 binary code for a fourth threshold level.

8. The memory as set forth in claim 6, wherein said first translator circuit comprises a circuit for translating said 0, 0 binary code to a 1, 0 gray code, for translating said 1, 0 binary code to a 0, 0 gray code, for translating said 0, 1 binary code to a 0, 1 gray code, and for translating said 1, 1 binary code to a 1,1 gray code.

9. A method for multi-level data storage, said method comprising the steps of:

providing a plurality of memory cells capable of storing more than two states in each memory cell;

storing one of a plurality of threshold levels in said memory cells to store more than one bit of data in each cell, wherein said threshold levels demarcate windows for designating more than a single bit of data for each memory cell;

sensing said one of said plurality of threshold levels from at least one selected memory cell;

generating a gray coded value to represent said one of said threshold levels sensed from said memory cell such that only one digit of said gray coded value changes state between adjacent threshold levels, wherein a decrease from one threshold level to a lower adjacent threshold level in a memory cell results in the change of only a single digit of said gray coded value.

10. The method as set forth in claim 9, further comprising the steps of:

receiving binary coded data for storage in said memory cells;

translating said binary coded data to gray coded data such that only one bit changes state between adjacent threshold levels; and writing said gray coded data in said plurality of memory cells.

11. The method as set forth in claim 9, wherein:

the step of storing a plurality of threshold levels further comprises the step of storing a plurality of threshold states in either a multi-level cell mode for storing more than a single bit per memory cell or a standard cell mode for storing a single bit per memory cell; and the step of translating said binary coded bits to gray coded bits further comprises the step of directly passing said binary coded bits thereby performing no translation when operating in said standard cell mode.

12. The method as set forth in claim 11, wherein the step of generating a gray coded value comprises the steps of:

receiving two bits of a binary code for translation into a two digit gray coded value;

executing an exclusive OR function on said two bits of said binary code to generate an exclusive OR output;

passing a first bit of said binary code to generate a first digit of said gray coded value when operating in said standard cell mode;

passing a second bit of said binary coded data to generate a second digit of said gray coded value; and passing said exclusive OR output to generate a first digit of said gray coded value when operating in said MLC mode.

13. The method as set forth in claim 9, wherein the step of providing a plurality of memory cells comprises the step of providing a plurality of flash electrically erasable read only memory (EEprom) cells.

14. The method as set forth in claim 9, wherein the step of storing one of a plurality of threshold levels in said memory cells to store at least one bit of data comprises the step of storing one of four threshold levels in said memory cells to store two bits of data.

15. The method as set forth in claim 14, wherein the step of generating at least one binary coded bit from said one of said plurality of threshold levels sensed comprises the steps of:

generating a 0, 0 binary code for a first threshold level;

generating a 1, 0 binary code for a second threshold level;

generating a 0, 1 binary code for a third threshold level; and generating a 1, 1 binary code for a fourth threshold level.

16. The method as set forth in claim 14, wherein the step of translating said binary coded bits to gray coded bits comprises the steps of:

translating said 0, 0 binary code to a 1, 0 gray code;
translating said 1, 0 binary code to a 0, 0 gray code;
translating said 0, 1 binary code to a 0, 1 gray code; and
translating said 1, 1 binary code to a 1,1 gray code.

17. A memory comprising:

storage means for storing one of a plurality of threshold levels, wherein said threshold levels demarcate windows for designating more than a single bit of data; and sensing means coupled to said storage cells for sensing said one of said threshold levels from said storage means, and for generating a gray coded value to represent said one of said threshold levels sensed such that only one digit of said gray coded value changes state between adjacent threshold levels, wherein a decrease from one threshold level to a lower adjacent threshold level in said storage means results in the change of only a single digit of said gray coded value, thereby providing increased reliability for said memory.

18. The memory as set forth in claim 17, further comprising:

translation means coupled to receive binary coded data for storage in said storage for translating said binary coded data to gray coded data such that only one bit changes state between adjacent threshold levels; and programming means coupled to said translation means for writing said gray coded data in said storage means.

19. The memory as set forth in claim 17, further comprising mode control means coupled to said storage means and said sensing means for controlling storage in said storage means to store more than a single bit per memory cell when operating in a multi-level cell mode, and for controlling storage in said storage means to store a single bit per memory cell when operating in a standard cell mode, said sensing means being configured to generate a binary coded value when operating in said standard cell mode.

* * * * *

UNITED STATES PATENT AND TRADEMARK OFFICE
CERTIFICATE OF CORRECTION

PATENT NO.    : 5,450,363
DATED         : September 12, 1995
INVENTOR(S)   : Christopherson et al.

It is certified that error appears in the above-identified patent and that said Letters Patent is hereby corrected as shown below:

In column 4 at line 22 delete "bate" and insert --gate--

In column 5 at line 29 insert --invention-- following "present" and prior to "is"

In column 6 at line 65 delete "VO$_L$" and insert --VOL--

In column 8 at line 63 delete "the then" and insert --then the--

In column 9 at line 4 delete "VOL$_o$" and insert --VOLe--

In column 10 at line 44 delete "Bit' and" and insert --Bit$_0$ and--

Signed and Sealed this

Fifteenth Day of October, 1996

Attest:

BRUCE LEHMAN

*Attesting Officer*    Commissioner of Patents and Trademarks